(12) United States Patent
Loh et al.

(10) Patent No.: US 9,818,455 B2
(45) Date of Patent: Nov. 14, 2017

(54) QUERY OPERATIONS FOR STACKED-DIE MEMORY DEVICE

(71) Applicant: Advanced Micro Devices, Inc., Sunnyvale, CA (US)

(72) Inventors: Gabriel H. Loh, Bellevue, WA (US); Nuwan S. Jayasena, Sunnyvale, CA (US); James M. O'Connor, Austin, TX (US); Yasuko Eckert, Bellevue, WA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 15/016,363

(22) Filed: Feb. 5, 2016

(65) Prior Publication Data

US 2016/0232097 A1 Aug. 11, 2016

Related U.S. Application Data

(63) Continuation of application No. 13/941,791, filed on Jul. 15, 2013, now Pat. No. 9,286,948.

(51) Int. Cl.
*G11C 5/02* (2006.01)
*G06F 12/02* (2006.01)
(Continued)

(52) U.S. Cl.
CPC ............ *G11C 5/025* (2013.01); *G06F 3/0608* (2013.01); *G06F 12/02* (2013.01); *G06F 12/0804* (2013.01); *G06F 12/0864* (2013.01); *G06F 17/30477* (2013.01); *G06F 17/30982* (2013.01); *G11C 5/02* (2013.01); *H01L 25/0657* (2013.01);
(Continued)

(58) Field of Classification Search
CPC ............ G06F 12/0804; G06F 3/0608; G06F 17/30982; G06F 17/30477; G06F 12/0864; G06F 2212/60; G11C 5/02
See application file for complete search history.

(56) References Cited

U.S. PATENT DOCUMENTS 5,391,917 A 2/1995 Gilmore et al.
7,623,365 B2 11/2009 Jeddeloh
(Continued)

OTHER PUBLICATIONS

Deng, Yangdong, et al.: "Physical Design of the 2.5D Stacked System," Proceedings 2003 IEEE International Conference on Computer Design: VLSI in Computers and Processors. ICCD 2003, San Jose, CA, Oct. 13-15, 2003, pp. 211-217.
(Continued)

*Primary Examiner* — Harry W Byrne
*Assistant Examiner* — Ajay Ojha

(57) ABSTRACT

An integrated circuit (IC) package includes a stacked-die memory device. The stacked-die memory device includes a set of one or more stacked memory dies implementing memory cell circuitry. The stacked-die memory device further includes a set of one or more logic dies electrically coupled to the memory cell circuitry. The set of one or more logic dies includes a query controller and a memory controller. The memory controller is coupleable to at least one device external to the stacked-die memory device. The query controller is to perform a query operation on data stored in the memory cell circuitry responsive to a query command received from the external device.

20 Claims, 9 Drawing Sheets

(51) Int. Cl.
*G06F 3/06* (2006.01)
*G06F 12/0804* (2016.01)
*G06F 12/0864* (2016.01)
*G06F 17/30* (2006.01)
*H01L 25/065* (2006.01)
*G06F 12/10* (2016.01)

(52) U.S. Cl.
CPC .......... *G06F 12/10* (2013.01); *G06F 2212/60* (2013.01); *H01L 2224/16227* (2013.01); *H01L 2924/15311* (2013.01)

(56) References Cited

U.S. PATENT DOCUMENTS

| | | | |
|---|---|---|---|
| 7,894,229 | B2 | 2/2011 | Lahtinen |
| 8,127,185 | B2 | 2/2012 | Jeddeloh |
| 8,710,655 | B2 | 4/2014 | Kim et al. |
| 9,030,253 | B1 | 5/2015 | Ngai |
| 9,064,715 | B2 | 6/2015 | Lee et al. |
| 9,164,147 | B2 | 10/2015 | Chi |
| 9,229,887 | B2 | 1/2016 | Jeddeloh |
| 2004/0148482 | A1* | 7/2004 | Grundy .................. G06F 12/06 711/167 |
| 2009/0190404 | A1* | 7/2009 | Roohparvar ......... G11C 15/046 365/185.17 |
| 2009/0313483 | A1* | 12/2009 | Ranade ............... G06F 11/1453 713/193 |
| 2010/0008058 | A1* | 1/2010 | Saen ..................... H01L 23/481 361/803 |
| 2010/0180150 | A1 | 7/2010 | Jeddeloh |
| 2011/0079924 | A1 | 4/2011 | Suh |
| 2012/0023376 | A1 | 1/2012 | Jeddeloh |
| 2012/0130983 | A1* | 5/2012 | Ryan ................. G06F 17/30985 707/715 |
| 2012/0297241 | A1 | 11/2012 | Jeddeloh |
| 2012/0319717 | A1 | 12/2012 | Chi |
| 2013/0007352 | A1* | 1/2013 | Maislos ............. G06F 12/0246 711/103 |
| 2013/0042060 | A1* | 2/2013 | Marukame ........ G06F 17/30982 711/108 |
| 2013/0073839 | A1* | 3/2013 | Hasegawa ........... G06F 12/0804 713/2 |
| 2013/0083804 | A1 | 4/2013 | Khoo et al. |
| 2013/0086353 | A1* | 4/2013 | Colgrove .............. G06F 3/0608 711/206 |
| 2013/0159812 | A1* | 6/2013 | Loh ..................... G06F 11/1048 714/758 |
| 2015/0309867 | A1 | 10/2015 | Kim |

OTHER PUBLICATIONS

Maxfield, Clive: "2D vs. 2.5D vs. 3D ICs 101," EE Times, Aug. 4, 2012, <url:http://www.eetimes.com/document.asp?doc_id=1279540>, accessed Aug. 23, 2016, 8 pages.
Sankaralingam, K., et al.: "Routed Inter-ALU Networks for ILP Scalability and Performance," Proceedings 2003 IEEE International Conference on Computer Design: VLSI in Computers and Processors, ICCD 2003, San Jose, CA, Oct. 13-15, 2003, 8 pages.
Athas W.C., et al.: "Multicomputer: Message-Passing Concurrent Computer," IEEE, vol. 21, No. 8, Aug. 1998, pp. 9-24.
Seitz, C.L.,: "Let's Route Packets Instead of Wires," Proceedings of the Sixth MIT Conference, Advanced Research on VLSI, Jan. 1990, 8 pages.
International Preliminary Report on Patentability correlating to PCT/US13/053596 (110209-PCT) dated Feb. 10, 2015, 5 pages.
EP Examination Report mailed May 27, 2016, for EP Application No. 13750437.9, 6 pages.
EP Supplemental Search Report mailed Jul. 28, 2016, for EP Application No. 13865761.4, 11 pages.
Nov. 21, 2016 Chinese Office Action issued in Application No. 201380041807.3, 13 pages.
Notice of Allowance dated Jan. 13, 2017, for U.S. Appl. No. 13/567,945, 41 pages.
Non-Final Office Action dated Jan. 27, 2017, for U.S. Appl. No. 14/715,023, 58 pages.
Notice of Allowance dated Jan. 25, 2016, for U.S. Appl. No. 14/551,147, 22 pages.
Notification of Reasons for Refusal dated Apr. 4, 2017 for JP Application No. 2015-526602, 7 pages.
Office Action dated May 4, 2017 in CN Application No. 201380041807.3, 15 pages.

\* cited by examiner

QUERY OPERATIONS FOR STACKED-DIE MEMORY DEVICE

BACKGROUND

Field of the Disclosure

The present disclosure generally relates to memory devices, and more particularly, to stacked-die memory devices.

Description of the Related Art

Memory bandwidth and latency are significant performance bottlenecks in many processing systems. These performance factors may be improved to a degree through the use of stacked-die memory (also called three-dimensional (3D) memory), which provides increased bandwidth and reduced intra-device latency through the use of through-silicon vias (TSVs) to interconnect multiple stacked dies of memory. System memory and other large-scale memory typically are implemented as separate from the other components of the system. A system implementing stacked-die memory therefore can continue to be bandwidth-limited due to the bandwidth of the interconnect connecting the stacked-die memory to the other components and latency-limited due to the propagation delay of the signaling traversing the relatively-long interconnect and the handshaking process needed to conduct such signaling. The inter-device bandwidth and inter-device latency have a particular impact on processing efficiency and power consumption of the system when a performed task requires multiple accesses to the stacked-die memory, such as a search operation or other query operation on a key-value store, as each access requires a back-and-forth communication between the stacked-die memory and a processor, and thus the inter-device bandwidth and latency penalties are incurred twice for each access.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION OF PREFERRED EMBODIMENTS

FIGS. 1-11 illustrate example techniques for improved processing efficiency and decreased power consumption in a processing system through the use of a stacked-die memory device implementing an integrated query controller to perform query operations on data stored in memory cell circuitry of the stacked-die memory device. The stacked-die memory device includes a set of one or more stacked memory dies and a set of one or more logic dies, wherein the one or more logic dies implement the query controller and a memory interface. The memory interface is coupled to the memory cell circuitry and is coupleable to one or more devices external to the stacked-die memory device. The memory interface operates to perform memory accesses in response to memory access requests from both the query controller and the one or more external devices.

In some embodiments, the stacked-die memory device implements a key-value store, and examples of query operations performed by the query controller include a key-indexed search operation to return an associated data object, a data-indexed search operation to return an associated key, a data object insertion operation, a data object write/modify operation, a data object clear/delete operation, and the like. Further, in some implementations the key-value store may comprise a single-instance, or deduplicated, data store, and the query controller may implement deduplication techniques accordingly. Further, in some embodiments, the stacked-die memory device may implement a RAM architecture, but the implementation of the query controller permits obfuscation of the underlying RAM architecture such that the stacked-die memory device operates as a content-addressable memory (CAM) from the perspective of the external devices. This CAM/key-value store facility provided by the query controller also can be leveraged to enable use of the stacked-die memory device as an external cache for one or more external devices.

Due to the query controller's tight integration with the memory dies, the query controller can access data stored in the memory dies with higher bandwidth and lower latency and power consumption compared to the external devices. Moreover, the offloading of query operations to the stacked-die memory device permits the external devices to perform other tasks, thereby increasing the overall processing throughput of the system.

Figure 1:
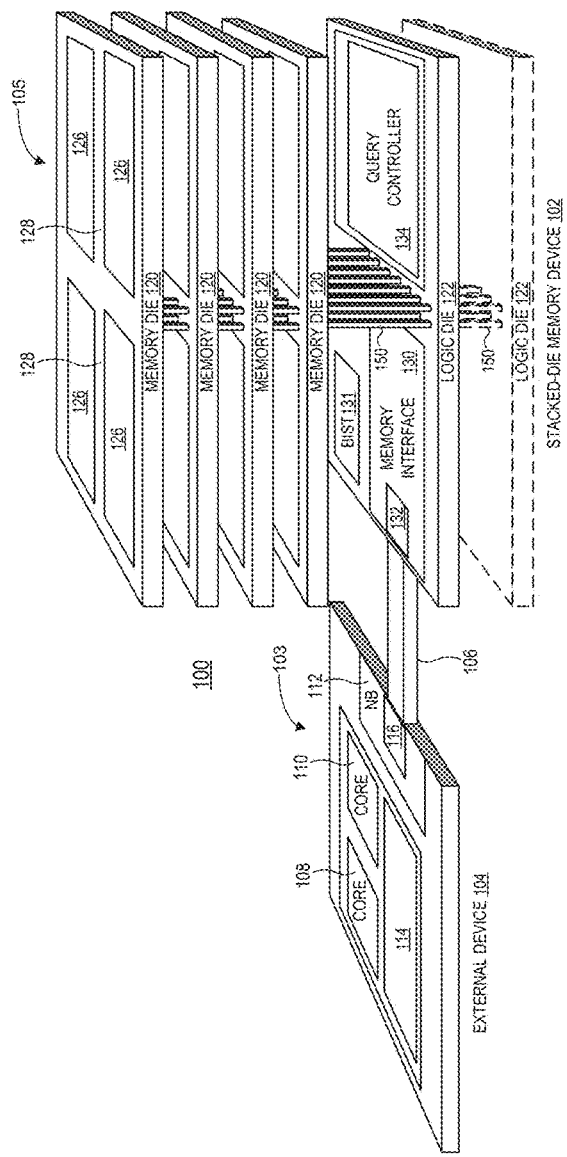
FIG. 1 is a diagram illustrating an exploded perspective view of a processing system employing a query controller in a vertical-stack configuration of a stacked-die memory device in accordance with some embodiments.

FIG. 1 illustrates a processing system 100 in accordance with some embodiments. The processing system 100 can comprise any of a variety of computing systems, including a notebook or tablet computer, a desktop computer, a server, a network router, switch, or hub, a computing-enabled cellular phone, a personal digital assistant, a gaming console, and the like. In the depicted example, the processing system 100 includes a stacked-die memory device 102 and at least one external device 104 coupled via an inter-device interconnect 106. The processing system 100 also can include a variety of other components not illustrated in FIG. 1, such as one or more display components, storage devices, input devices (e.g., a mouse or keyboard), and the like. While the processing system 100 can include multiple external devices 104 coupled to the stacked-die memory device 102 via the inter-device interconnect 106, an example implementation with a single external device 104 is described herein for ease of illustration. In some embodiments, the external device 104 is implemented as an integrated circuit (IC) package 103 and the stacked-die memory device 102 is implemented as an IC package 105 separate from the IC package 103 implementing the external device 104. In other embodiments, the external device 104 and the stacked-die memory device 102 are implemented as separate sets of dies connected via an interposer in the same IC package. In either instance, the external device 104 is "external" with reference to the stacked-die memory device 102.

In the illustrated example, the external device 104 is a processing device, although an external device 104 can be other types of devices. In this example, the external device 104 comprises one or more processor cores, such as processor cores 108 and 110, a northbridge 112, and peripheral components 114. The processor cores 108 and 110 can include any of a variety of processor cores and combinations thereof, such as a central processing unit (CPU) core a graphics processing unit (GPU), a digital signal processor (DSP), and the like. The peripheral components 114 can include, for example, an integrated southbridge or input/output controller, one or more level 3 (L3) caches, and the like. The northbridge 112 includes, or is associated with, a memory controller interface 116 comprising a physical interface (PHY) connected to the conductors of the inter-device interconnect 106.

The inter-device interconnect 106 can be implemented in accordance with any of a variety of conventional interconnect or bus architectures, such as a Peripheral Component Interconnect-Express (PCI-E) architecture, a HyperTransport architecture, a QuickPath Interconnect (QPI) architecture, and the like. Alternatively, the inter-device interconnect 106 can be implemented in accordance with a proprietary bus architecture. The inter-device interconnect 106 includes a plurality of conductors coupling transmit/receive circuitry of the memory interface 116 of the external device 104 with the transmit/receive circuitry of the memory interface 130 of the stacked-die memory device 102. The conductors can include electrical conductors, such as printed circuit board (PCB) traces or cable wires, optical conductors, such as optical fiber, or a combination thereof.

The stacked-die memory device 102 may implement any of a variety of memory cell architectures, including, but not limited to, volatile memory architectures such as dynamic random access memory (DRAM) and static random access memory (SRAM), or non-volatile memory architectures, such as read-only memory (ROM), flash memory, ferroelectric RAM (F-RAM), magnetoresistive RAM, phase-change memory (PCM), spin-torque-transfer magnetic memory (STT-MRAM), resistive RAM (ReRAM), and the like. For ease of illustration, the example implementations of the stacked-die memory device 102 are described herein in the example, non-limiting context of a DRAM architecture.

As illustrated by the exploded perspective view, the stacked-die memory device 102 comprises a set of one or more stacked memory dies 120 and a set of one or more logic dies 122. Each memory die 120 comprises memory cell circuitry 126 implementing bitcells in accordance with the memory architecture of the stacked-die memory device 102 and the peripheral logic circuitry 128 implements the logic and other circuitry to support access and maintenance of the bitcells in accordance with this memory architecture. To illustrate, DRAM typically is composed of a number of ranks, each rank comprising a plurality of banks, and each bank comprising a matrix of bitcells set out in rows and columns. Accordingly, in some embodiments, each memory die 120 may implement one rank (and thus the banks of bitcells for the corresponding rank). In another embodiment, the DRAM ranks each may be implemented across multiple memory dies 120. For example, the stacked-die memory device 102 may implement four ranks, with each rank implemented at a corresponding quadrant of each of the memory dies 120. In either implementation, to support the access and maintenance of the DRAM bit cells, the peripheral logic circuitry 128 may include, for example, line drivers, bitline/wordline precharging circuitry, refresh circuitry, row decoders, column select logic, row buffers, sense amplifiers, and the like. Further, as described in greater detail below with reference to FIG. 4, in some embodiments the stacked memory dies 120 also may implement in-situ row buffer search logic to facilitate parallel associative search operations on the row buffers of the DRAM banks implemented at the stacked memory dies 120.

The one or more logic dies 122 implement logic to facilitate access to the memory of the stacked-die memory device 102. This logic includes, for example, the memory interface 130, built-in self test (BIST) logic 131, and the like. The memory interface 130 can include, for example, receivers and line drivers, memory request buffers, scheduling logic, row/column decode logic, refresh logic, data-in and data-out buffers, clock generators, and the like. Although the illustrated embodiment depicts a memory controller 116 implemented at the external device 104, in other embodiments, a memory controller instead may be implemented at the memory interface 130. The memory interface 130 further comprises a bus interface 132 comprising a PHY coupleable to the conductors of the inter-device interconnect 106, and thus coupleable to the external device 104.

In addition to implementing logic to facilitate access to the memory implemented by the memory dies 120, one or more logic dies 122 implement a query controller 134 to perform query operations on data maintained at the stacked-die memory device 102 for the benefit of the external device 104 or other external component of the processing system 100. These query operations can include any of a variety of query operations typically implemented in databases or other data stores, such as search operations, insert operations, write operations, delete operations, sort operations, join operations, and the like. In some embodiments, these query operations are performed by the query controller 134 on behalf of the external device 104, thus offloading the processing effort to conduct the query operations from the external device. As described below, the processing system 100 can leverage the operation of the query controller 134 so that the stacked-die memory device 102 may be used as a key-value store, a content-addressable memory (CAM), an external cache, and the like.

In the illustrated example, the query controller 134 and the memory interface 130 are implemented on the same logic die 122. In other embodiments, the memory interface 130 and the query controller 134 may be implemented on different logic dies. For example, the memory interface 130 may be implemented at one logic die 122 and the query controller 134 may be implemented at another logic die 122. In yet another embodiment, one or both of the memory interface 130 and the query controller 134 may be implemented across multiple logic dies. To illustrate, the memory interface 130 and search logic circuitry of the query controller 134 may be implemented at one logic die 122, while compare logic circuitry of the query controller 134 may be implemented at another logic die 122. The query controller 134 comprises hardcoded logic, programmable logic, a helper processor executing software, or a combination thereof, to perform one or more query operations on a data store implemented in the memory die of the stacked-die memory device. An example of a helper processor that may be used to implement the query controller, in part or in whole, is described in U.S. patent application Ser. No. 13/567,958, filed Aug. 6, 2012 and entitled "Stacked-Die Memory Device with Helper Processor," the entirety of which is incorporated by reference herein.

In the depicted implementation of FIG. 1, the stacked-die memory device 102 is implemented in a vertical stacking arrangement whereby power and signaling are transmitted between the logic dies 122 and the memory dies 120 using dense through silicon vias (TSVs) 150 or other vertical interconnects. Although FIG. 1 depicts the TSVs 150 in a set of centralized rows, the TSVs 150 instead may be more dispersed across the floorplans of the dies. Note that FIG. 1 provides an exploded-view representation of the dies 120 and 122 to permit illustration of the TSVs 150 and the components of the dies 120 and 122. In implementation, each of the dies overlies and is in contact with the preceding die. In some embodiments, the query controller 134 accesses with the memory implemented at the memory dies 120 directly via the TSVs 150 (that is, the query controller 134 implements its own memory controller). In another embodiment, the memory interface 130 controls access to the TSVs 150 and thus the query controller 134 accesses the memory dies 120 through the memory interface 130.

The stacked-die memory device 102 may be fabricated using any of a variety of 3D integrated circuit fabrication processes. In one approach, the dies 120 and 122 each are implemented as a separate substrate (e.g., bulk silicon) with active devices and one or more metal routing layers formed at an active surface (that is, each layer comprises a separate die or "chip"). This approach can include a wafer-on-wafer process whereby a wafer comprising a matrix of dice is fabricated and thinned, and TSVs are etched through the bulk silicon. Multiple wafers are then stacked to achieve the illustrated layer configuration (e.g., a stack of four wafers comprising memory circuitry dies for the four memory dies 120 and a wafer comprising the logic die for the logic die 122), aligned, and then joined via thermocompression. The resulting stacked wafer set is singulated to separate the individual 3D IC devices, which are then packaged. In a die-on-die process, the wafer implementing each corresponding layer is first singulated, and then the dies are separately stacked and joined to fabricate the 3D IC devices. In a die-on-wafer approach, wafers for one or more layers are singulated to generate the dice for one or more layers, and these dice are then aligned and bonded to the corresponding die areas of another wafer, which is then singulated to produce the individual 3D IC devices. One benefit of fabricating the dies 120 and 122 as dice on separate wafers is that a different fabrication process can be used to fabricate the logic dies 122 than that used to fabricate the memory dies 120. Thus, a fabrication process that provides improved performance and lower power consumption may be used to fabricate the logic dies 122 (and thus provide faster and lower-power interface logic and circuitry for the query controller 134), whereas a fabrication process that provides improved cell density and improved leakage control may be used to fabricate the memory dies 120 (and thus provide more dense, lower-leakage bitcells for the stacked memory).

In another approach, the dies 120 and 122 are fabricated using a monolithic 3D fabrication process whereby a single substrate is used and each layer is formed on a preceding layer using a layer transfer process, such as an ion-cut process. The stacked-die memory device 102 also may be fabricated using a combination of techniques. For example, the logic dies 122 may be fabricated using a monolithic 3D technique, the memory dies may be fabricated using a die-on-die or wafer-on-wafer technique, or vice versa, and the resulting logic die stack and memory die stack then may be bonded to form the 3D IC device for the stacked-die memory device 102.

Figure 2:
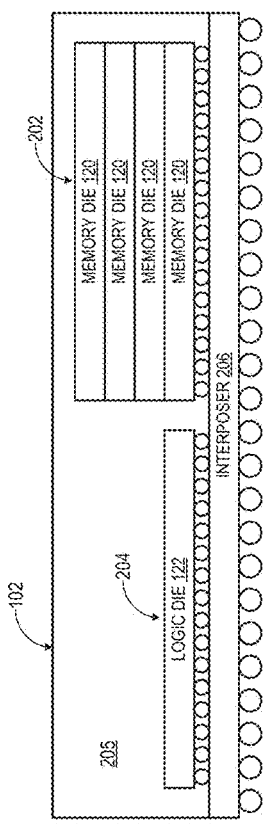
FIG. 2 is a diagram illustrating a cross-section view of an alternative implementation of the stacked-die memory device of FIG. 1 in a side-split configuration in accordance with some embodiments.

FIG. 2 illustrates a cross-section view of an alternative implementation of the stacked-die memory device 102 in accordance with some embodiments. Rather than implement a vertical stack implementation as shown in FIG. 1 whereby the one or more logic dies 122 are vertically aligned with the memory dies 120, the stacked-die memory device 102 instead may implement the side-split arrangement of FIG. 2 whereby the stacked memory dies 120 are implemented as an IC device 202 and the one or more logic dies 122 are implemented as a separate IC device 204, and the IC devices 202 and 204 (and thus the logic dies 122 and the memory dies 120) are connected via an interposer 206. The interposer can comprise, for example, one or more levels of silicon interposers, a printed circuit board (PCB), or a combination thereof. Although FIG. 2 illustrates the stacked memory dies 120 together implemented as a single IC device 202, the stacked memory dies 120 instead may be implemented as multiple IC devices 202, with each IC device 202 comprising one or more memory dies 120. Likewise, the logic dies 122 may be implemented as a single IC device 204 or as multiple IC devices 204. The one or more IC devices 202, the one or more IC devices 204, and the unifying substrate 206 are packaged as an IC package 205 representing the stacked-die memory device 102.

Figure 3:
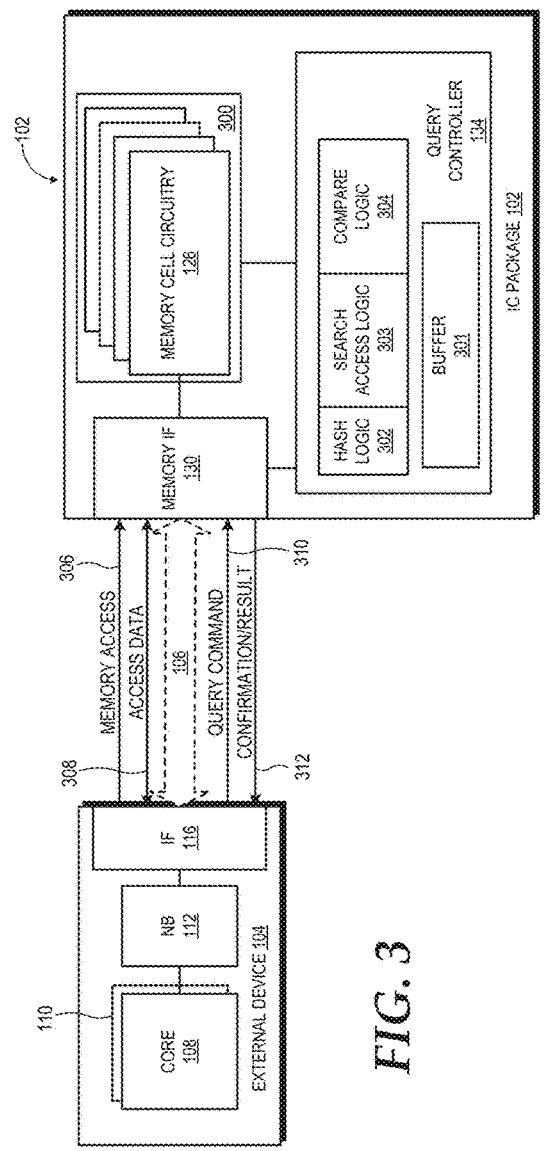
FIG. 3 is a block diagram illustrating the processing system of FIG. 1 in greater detail in accordance with some embodiments.

FIG. 3 illustrates the processing system 100 in block diagram form in accordance with some embodiments. As noted above, the processing system 100 includes one or more external devices 104 and the stacked-die memory device 102 coupled via an inter-device interconnect 106, whereby the stacked-die memory device 102 implements a stacked memory 300 represented by multiple stacked memory dies 120 of memory cell circuitry 126 and implements the query controller 134 to perform one or more query operations with respect to a data store implemented in the stacked memory 300. The stacked-die memory device 102 further includes the memory interface 130 to perform memory accesses in response to memory access requests from both the external device 104 and the query controller 134.

In the depicted implementation, the query controller 134 comprises a buffer 301 (or other data storage element), hash logic 302, search access logic 303, and compare logic 304. The buffer 301 serves to temporarily store data accessed from the stacked memory 300 in the process of performing a query operation, data to be stored to the stacked memory 300 in the process of performing a query operation, and configuration data received as part of a query command from the external device 104. The hash logic 302 operates to perform one or more hash functions on a key value or other value to generate an index value, which is then used by the search access logic 303 to access a memory location in the stacked memory 300 based on the index value. The compare logic 304 operates to analyze the accessed data to detect a match in accordance with specified search criteria, or to sort or otherwise organize a set of data accessed from the stacked memory 300 during the performance of a query operation.

In some embodiments, the stacked-die memory device 102 can function as a conventional system memory for storing operational data on behalf of other system components. In a conventional memory access operation, the external device 104 (or other system component) issues a memory access request 306 by manipulating the PHY of its memory interface 116 to transmit address signaling and, if the requested memory access is a write access, data signaling via the inter-device interconnect 106 to the stacked-die memory device 102. The PHY of the memory interface 130 receives the signaling, buffers the memory access request represented by the signaling, and then accesses the memory cell circuitry 126 to fulfill the requested memory access. In the event that the memory access request 306 is a write access, the memory interface 130 stores the signaled operational data to the location of the memory 300 indicated by the signaled address. In the event that the memory access request 306 is a read request, the memory interface 130 accesses the requested operational data from the location of the memory 300 corresponding to the signaled address and manipulates the PHY of the memory interface 130 to transmit signaling representative of the accessed operational data 308 to the external device 104 via the inter-device interconnect 106.

In addition to, or instead of, providing conventional system memory functionality, the stacked-die memory device 102 also can function to offload the task of managing query operations for the external devices 104 of the processing system 100. In some embodiments, the query controller 134 of the stacked-die memory device 102 performs one or more query operations responsive to a query command 310 received from the external device 104 via the inter-device interconnect 106 or via a side-band bus (not illustrated). For example, the processing system 100 may implement the stacked-die memory device 102 as a key-value memory, and thus the query command 310 may be a key search command that provides, for example, a key value. In response to this key search command request, the stacked-die memory device 102 performs a search operation (one example of a query operation) in the stacked memory 300 to identify a memory location storing a matching key value, and then return to the external device 104 a data object stored at the memory location in association with the matching key value. Other example query operations that may be performed in response to the query command 310 include sorting operations, filtering operations, grouping operations, joining operations, converting operations, and the like. The query controller 134 can provide a response 312 to the query command 310 issued by the external device 104, whereby the response 312 can include, for example, a confirmation that the query command 310 has been received and carried out, or a result of the performance of the one or more query operations represented by the query command 310.

The query controller 134 further can perform query operations independent of commands or other signaling from the external device 104. Certain query operations may be software-invisible or background operations run independent of the external device 104. One such query operation can include, for example, the rebalancing of a key-value store. Assuming that objects A and B both hash into the same index X, if object A is inserted first, then object A is placed at location X and when object B is subsequently inserted, it would be placed at location X+1. Thus, each time the key-value store is searched for object B, location X is first searched (because that would be the initial target of a hash on object B), and then location X+1. Later on, if object A is removed from the key-value store, object B would otherwise remain at location X+1 even though location X is now available. To address this scenario, an external-command-independent query operation can include a rehashing operation to relocate object B from location X+1 to location X so that future accesses for object B will be faster (as only location X will need to be checked, rather than both location X and then location X+1). Such a rehash operation can be performed, for example, in response to removing object A from location X, or the query controller 134 can be configured to periodically walk through the key-value store to relocate such less-optimally placed objects.

The query facility of the query controller 134 permits the stacked-die memory device 102 to implement a RAM-based architecture, but also permits content-based data location, thereby permitting the stacked-die memory device 102 to operate as a key-value store. This key-value store implementation permits the stacked-die memory device 102 to operate transparently as a deduplicated, or single-instance, data store, which is useful in using the stacked-die memory device 102 as, for example, a CAM or an external cache for the external device 104. Examples of these operations are described below with reference to FIGS. 4-10.

Figure 4:
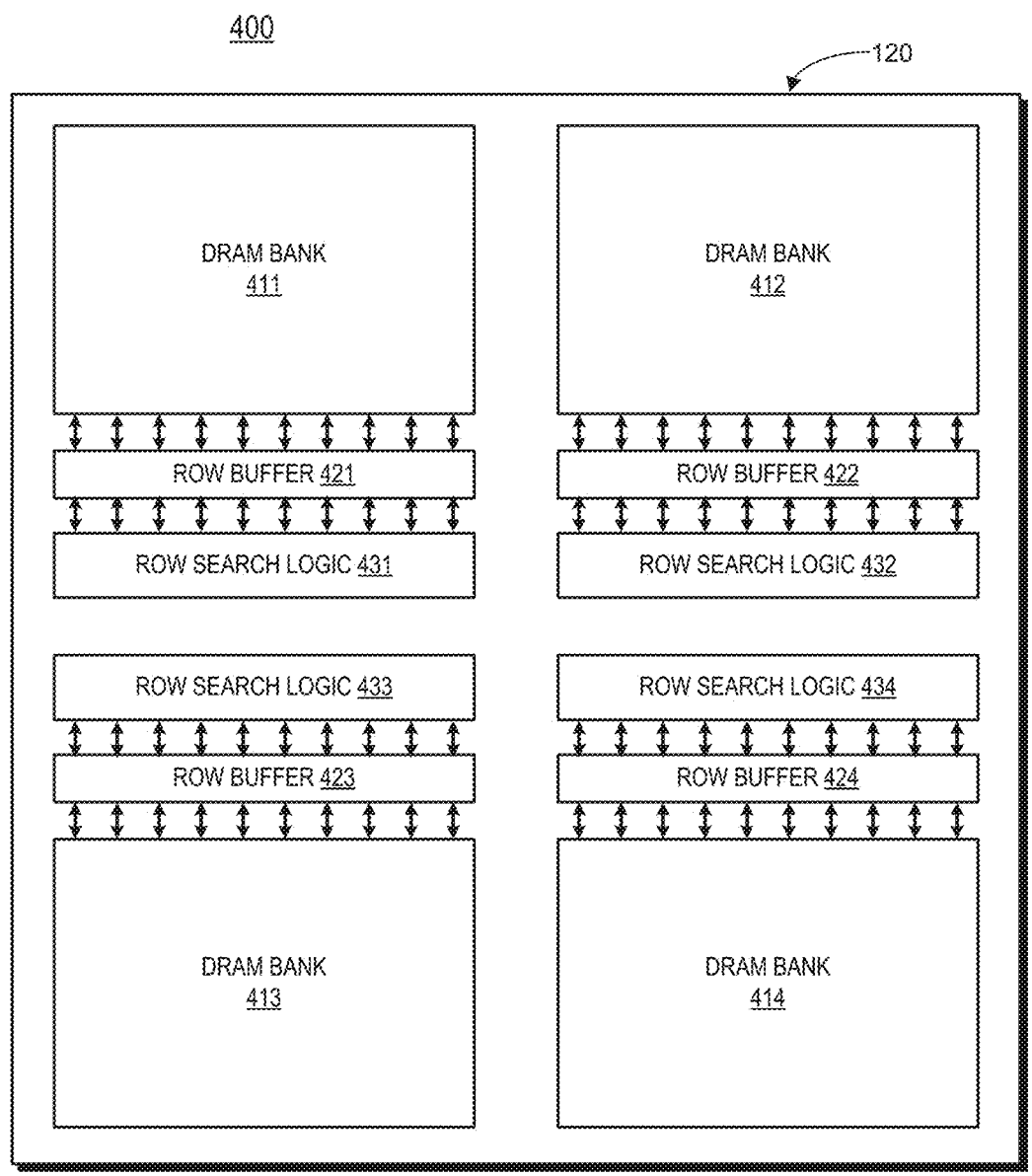
FIG. 4 is a plan view of a simplified representation of a dynamic random access memory (DRAM) memory die having in-situ row buffer search logic for searching row buffers in accordance with some embodiments.

FIG. 4 illustrates a top plan view of a simplified floorplan 400 of a memory die 120 of the stacked-die memory device 102 in accordance with some embodiments. The query operations performed by the query controller 134 often incorporate one or more search operations. To facilitate these search operations, the query controller 134 can implement parallel associative search logic at the memory dies 120. The proximity of the search logic to the memory being searched can provide improved search times, as well as provide the ability to search multiple portions of memory in parallel. To illustrate, the floorplan 400 of FIG. 4 illustrates a memory die 120 implementing the memory cell circuitry 126 (FIG. 1) as a set of DRAM banks, such as DRAM banks 411, 412, 413, and 414. In accordance with conventional DRAM architectures, each DRAM bank includes a corresponding row buffer (e.g., row buffers 421, 422, 423, and 424) to buffer the data stored in an accessed row of the corresponding DRAM bank. The memory die 120 further can implement row buffer search logic (e.g., row buffer search logic 431, 432, 433, and 434) for each row buffer, whereby each row buffer search logic receives a search command from the search access logic 303 (FIG. 3) indicating one or more search criteria, and performs a search operation on the corresponding row buffer in response. The search criteria can include, for example, a specific value, a value range, a partial search value that uses one or more wildcards, a relationship condition (e.g., "greater than", "less than", etc.) and the like.

The row buffers 421, 422, 423, and 424 typically are relatively wide interfaces and thus provide an opportunity to provide effective parallel search capabilities. To illustrate, with a 2048-*bit* row buffer, the corresponding row buffer search logic can perform an associative search that performs 64 32-bit comparisons in parallel. With all four of row buffer search logic 431, 432, 433, and 434 performing the same search operation in parallel on their respective row buffers, this results in 256 32-bit comparisons performed in parallel at this single memory die 120. The other memory die 120 may implement the same configuration, and thus the same process may be repeated in parallel at the other memory die 120. In this manner, the row buffer search logic can quickly increment through or otherwise traverse through the rows of the DRAM banks of the stacked memory 300 until a matching value is found or it is confirmed that the stacked memory 300 does not store a matching value.

In some embodiments, the row buffer search logic and the other logic of the query controller 134 use the TSVs 150 (FIG. 1) connecting the memory dies 120 and the logic dies 122 to send the search commands and associated information to the row buffer search logic at the memory dies 120 and to send the results of the search operations from the row buffer search logic to the logic of the query controller 134 disposed at the logic dies 122. In other embodiments, the parallel row buffer search logic is implemented at one or more logic dies 122, and then coupled to the corresponding row buffers of the memory dies 120 via the TSVs 150.

Figure 5:
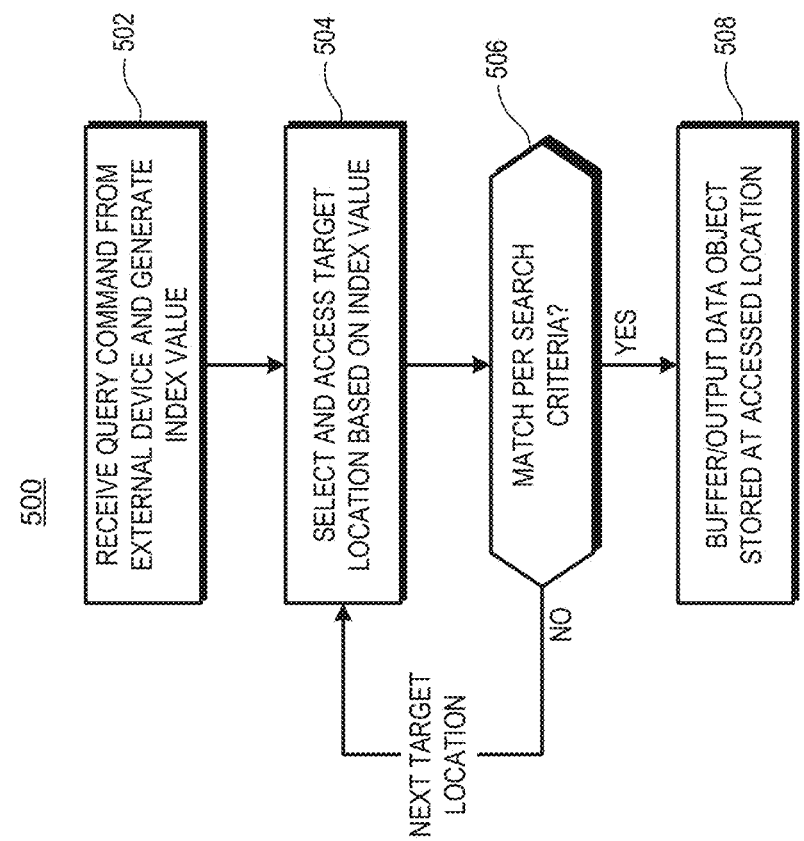
FIG. 5 is a flow diagram illustrating a method for conducting a query operation in a key-value store implemented in a stacked-die memory device in accordance with some embodiments.

FIG. 5 illustrates an example method 500 for performing a search operation as part of a query operation performed by the query controller 134 of the stacked-die memory device 102 in accordance with some embodiments. For ease of illustration, the method 500 is described in the example context of the implementation of the query controller 134 of FIG. 3. In this example context, the stacked memory 300 implements a key-value store that is operated upon by the query controller 134. The method 500 initiates with the issuance of a query command 310 from the external device to the stacked-die memory device 102 at block 502. Typically, the query command 310 expressly or inherently implicates a search operation to be performed. For this search operation, a search key and one or more search criteria typically are provided with, or inferred from, the query command. The search key can be a specific data primitive, such as an integer value, a floating point value, a character, a string, a Boolean value, and the like. The one or more search criteria typically specify the requirements in order to identify a match between an examined value and the search key. This search criteria may take the form of, for example, a wildcard, a range relative to the search key, a relationship condition (e.g., "greater than", "not equal to", etc.), and the like. In some instances, the search key itself may incorporate a search criterion. To illustrate, the receipt of a search key "A*" indicates, via the incorporated wildcard "*", that a match is found with any access data object that starts with an "A" character. In a CAM implementation or cache implementation, the search key can include, for example, a memory address, or a portion thereof, and the search criteria may be inferred to require an exact match with the specified memory address.

In response to the query command 510, the query controller 134 initiates the performance of a query operation specified by the query command 510. Typically, the query operation includes a search operation to locate, access, write, clear, or otherwise modify one or more data object stored in, or to be stored in, the key-value store. Such data objects can include, for example, a data primitive, such as an integer or floating-point value, a character, a string, or they can include a data structure, e.g., a table, tree, matrix, or linked list, that comprises multiple data primitives or smaller data structures. The stacked memory 300 typically is implemented as a RAM and thus an address is needed to access a particular location in the stacked memory 300. Accordingly, at block 504 the hash logic 302 performs one or more hash operations on a search key supplied in association with the query command 310. To illustrate, for a CAM or cache implementation, the query command can comprise a memory address, which in turn is implemented as the search key. In a more typical key-value store implementation, the data consumer (e.g., the external device 104) is supplied with a "handle" when a data object is stored in the key-value store, and when the data consumer subsequently wants to access the data object again, it supplies this handle as the search key.

The application of the one or more hash operations to this search key generates an initial index value. At block 506, the search access logic 303 uses this index value to select a target location within the stacked memory 300 and then accesses the target location to obtain the data stored therein. Each location of the key-value store in the stacked memory 300 includes a key field and a data object field, whereby the key field stores a key and the data object field stores a data object. The key and the data object stored in the targeted location then may be stored in the buffer 301. To determine whether the target location stores the data object of interest, at block 506 the compare logic 304 compares the search key with the key accessed from the target location to determine whether they match in accordance with the specified search criteria. As noted above, the search criteria may require an exact match (e.g., the accessed key and the search key are exact duplicates), or the search criteria may specify a range of values or one or more wildcards that define a range or degree by which the accessed key may differ from the search key while being considered a match under the search criteria.

In the event that the accessed key does not match the search key, the flow returns to block 504, whereupon the index value is adjusted (e.g., incremented) and the processes of blocks 504 and 506 of selecting and accessing the next target location in the key-value store and then determining whether the accessed key stored therein matches the search key are repeated using the adjusted index value. In this manner, the memory locations constituting the key-value store are searched until either an accessed key matches the search key or the entire key-value store has been searched. As noted above, this search can be performed through a parallel associative search using, for example, the row buffer search logic for searching row buffers in parallel.

In the event that an accessed key obtained during an iteration of blocks 504 and 506 matches the search key, at block 508 the data object stored with the matching accessed key or otherwise associated with the matching accessed key is output to either or both of the buffer 301 or the external device 104. To illustrate, the query command 310 may represent a search for a single instance of a data object associated with a key that matches the search key. In such instances, the data object stored with the key that matches the search key is provided as the result 312 of the query operation. In other instances, the query command 310 may represent a search that may have multiple results. For example, a search operation having search criteria specifying a range, a wildcard, or relationship (e.g., "return all values greater than X") may result in the identification of multiple key-value pairs in the stacked memory 300 that meet the search criteria. In such instances, the data object associated with each matching instance may be buffered in the buffer 301 and all such data objects found in the stacked memory 300 may then be output as a group to the external device 104 as the result 312 when the search is completed.

Figure 6:
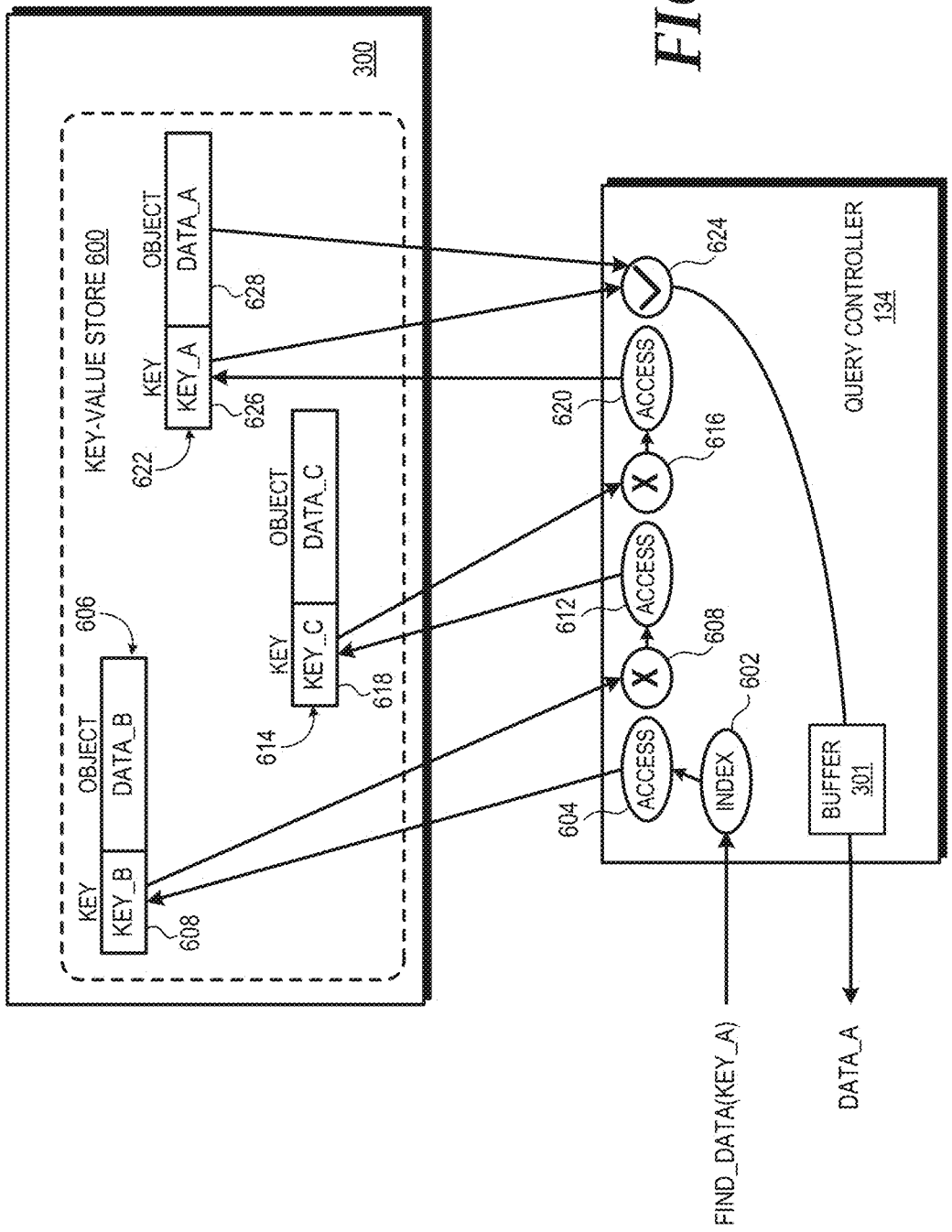
FIG. 6 is a block diagram illustrating an example of the method of FIG. 5 in accordance with some embodiments.

FIG. 6 illustrates a simplified example operation of the method 500 of FIG. 5 in accordance with some embodiments. In the depicted example, the external device 104 issues a query command 310 in the form of a key search command FIND_DATA(KEY_A) that instructs the query controller 134 to return the data object associated with a search key KEY_A in a key-value store 600 implemented in the stacked memory 300. In response to this command, the hash logic 302 performs an indexing operation 602 by performing a hash operation on the search key KEY_A to generate an initial index value. The search access logic 303 then performs an access operation 604 to a location 606 in the key-value store 600 having an address represented by the initial index value. The compare logic 304 performs a compare operation 608 to compare the key KEY_B stored in the key field 610 with the key KEY_A. In this example, KEY_B is not a match to KEY_A, and thus the search access logic 303 increments the index value and performs another access operation 612 to a location 614 in the key-value store 600 having an address represented by the incremented index value. The compare logic 304 performs a compare operation 616 to compare the key KEY_C stored in the key field 618 with the key KEY_A. As with before, KEY_C is not a match to KEY_A, and thus the search access logic 303 again increments the index value and performs another access operation 620 to a location 622 in the key-value store 600 having an address represented by the twice-incremented index value. The compare logic 304 performs a compare operation 624 to compare the key KEY_A stored in the key field 626 of the location 622 with the key KEY_A. In this instance, the comparison reveals a match, and thus the query controller 134 outputs the data object DATA_A stored in the object field 628 of the location 622 to the buffer 301, whereupon it may be temporarily stored for other query operations (e.g., for sorting, filtering, or ordering operations) or forwarded on to the external device 104.

Although FIGS. 5 and 6 illustrate an example method for a key-based search for a data object in a key-value store, a similar process may be used for a value-based search for a key in a key-value store. In this approach, rather than searching for a matching key, the query command 310 instead comprises a data search command that supplies a data value or other data object as the search key, and the data object fields of the memory locations are searched to find a match. Upon detecting a match, the key in the key field associated with the matching data object is returned. In this way, the external device 104 can identify the handle, or pointer, associated with a data object stored in the key-value store using a data search command. Unless otherwise noted, the techniques described herein with respect to key-based searches may be utilized for value-based searches, and vice-versa.

Figure 7:
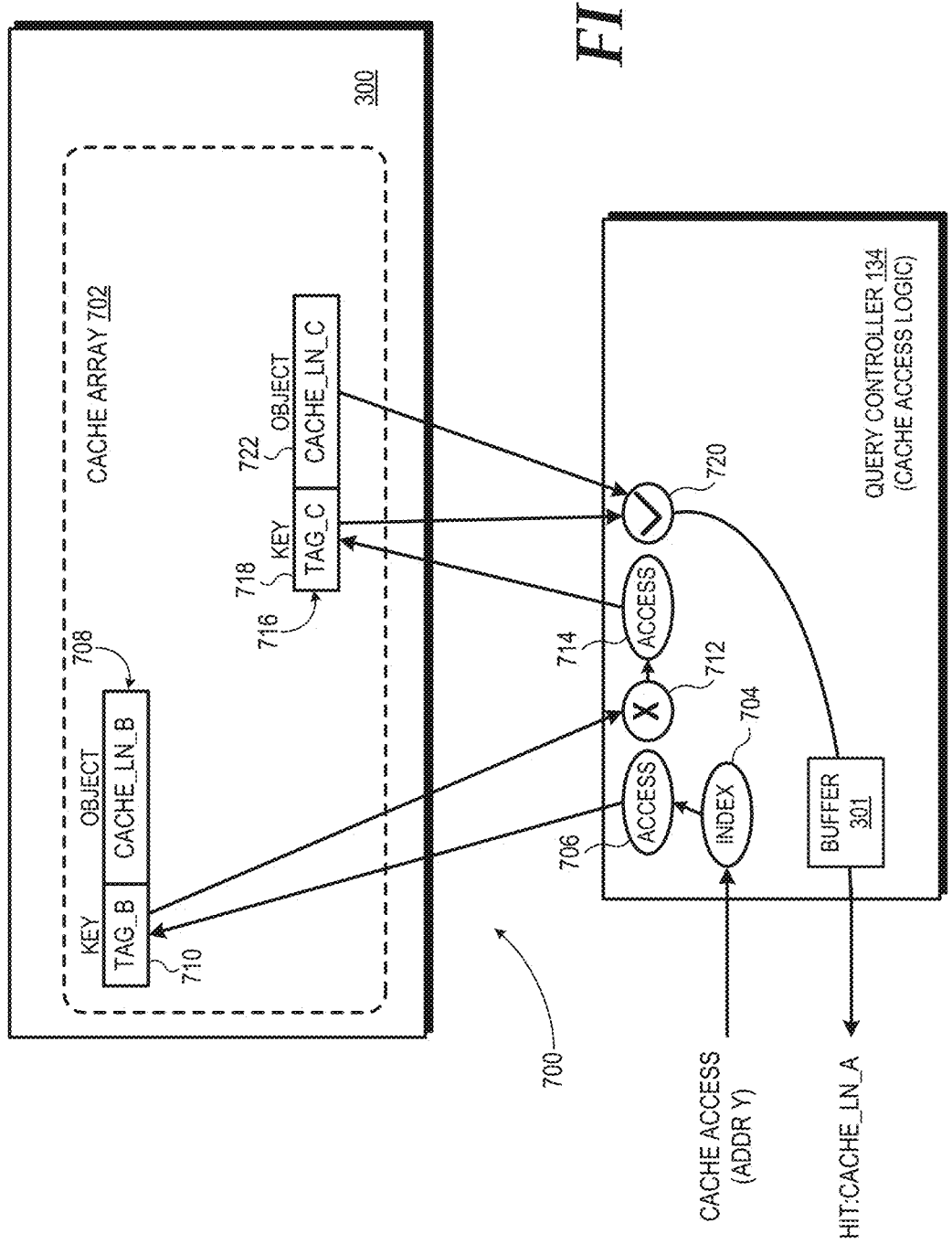
FIG. 7 is a block diagram illustrating an example implementation of a stacked-die memory device as a cache in accordance with some embodiments.

FIG. 7 illustrates an example operation of a cache 700 implemented at the stacked-die memory device 102 in accordance with some embodiments. The query operations performed by the query controller 134 on a key-value store implemented in the stacked memory 300 permit content-based searches for data, rather than memory address-based accesses, and thus enable the stacked-die memory device 102 to be implemented as a cache for the external device 104. In the depicted example, the cache 700 implements a key-value store in the stacked memory 300 as a cache array 702 and implements the query controller 134 as the cache access logic for the cache array 702. Each memory-addressed location in the cache array 702 represents a cache line, and includes a key field that represents a cache tag field and stores a cache tag and a data object field that represents a cache line field and stores a cache line of data. Thus, the tag array typically found in a cache is implemented by the key fields of the memory locations, and the array of cache lines typically found in a cache are implemented by the data object fields of the memory locations.

When a cache access command is received for a memory address ADDR_Y, the query controller 134 performs an index operation 704 to generate an index value, which is used by the query controller 134 in an access operation to access a location 708 in the cache array 702. In this example, the key field 710 of the location 708 stores a cache tag with an address value TAG_B, which does not match the address ADDR_Y. Accordingly, in response to identifying this non-match as a result of a compare operation 712, the query controller 134 increments the index value and performs an access operation 714 to access a location 716 associated with the incremented index value. In this example, the key field 718 stores a cache tag with an address value TAG_C, which represents a memory address range that includes the address ADDR_Y. From a compare operation 720 the query controller 134 identifies this address range match and thus signals a cache hit and outputs to the external device 104 the cache line CACHE_LN_C stored at the data object field 722 of the location 716 as the cache line data stored in the cache array 702. The identification of the memory location storing the address of interest can likewise be used by the query controller 134 for other caching operations, such as storing data to a cache line, modifying a cache line, or evicting data from a cache line to another memory.

Figure 8:
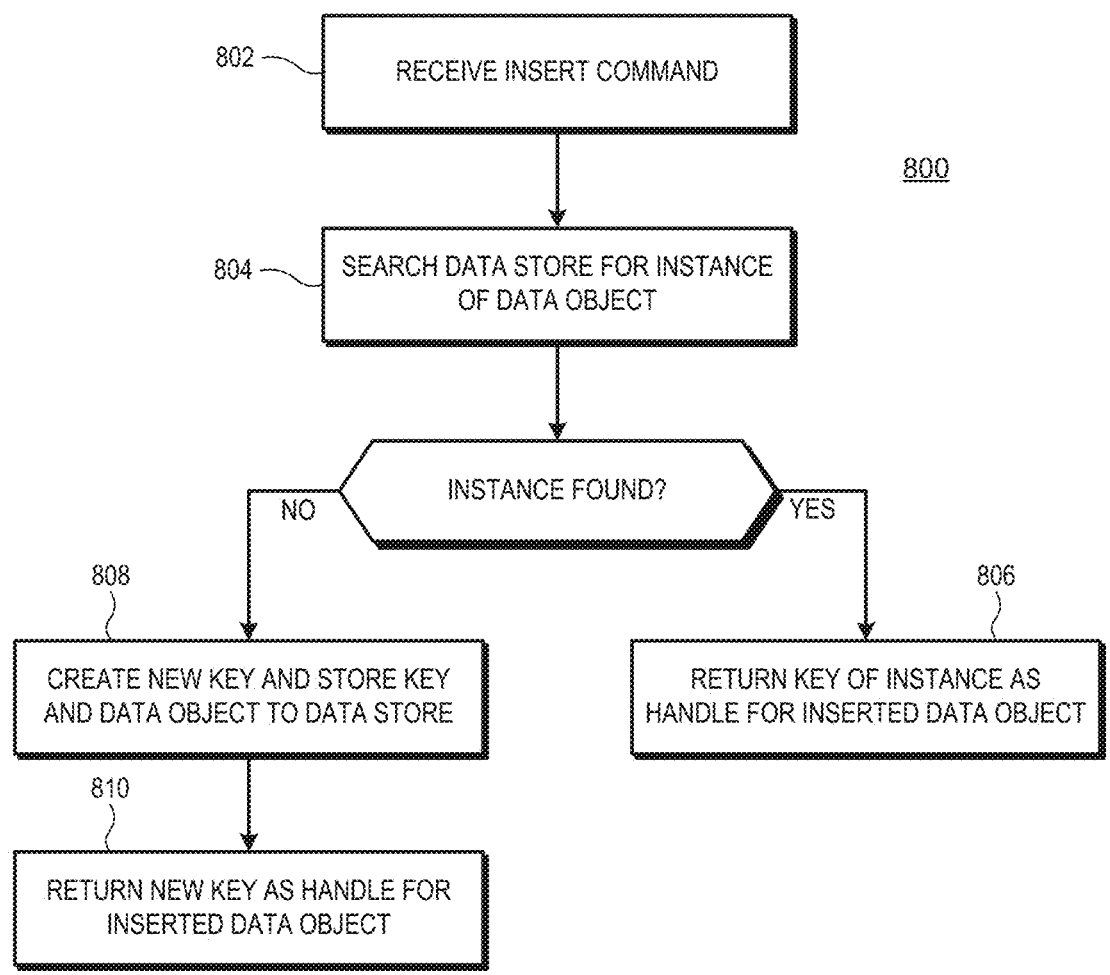
FIG. 8 is a flow diagram illustrating a method for conducting an insert query operation in a single-instance store implemented in a stacked-die memory device in accordance with some embodiments.

FIG. 8 illustrates a method 800 for inserting a data object into a single-instance store implemented in the stacked memory 300 of the stacked-die memory device 102 in accordance with some embodiments. For ease of illustration, the method 800 is described in an example context of the implementation of the query controller 134 of FIG. 3. In this example context, the stacked memory 300 implements a single-instance store that is operated upon by the query controller 134. Single-instance stores, also known as deduplicated stores, are a particular implementation of a key-value store that stores only a single instance of a given data object. This approach prevents data redundancy, and thus single-instance stores typically are relatively compact. However, the single-instance limitation on such stores requires stringent deduplication techniques to prevent duplicate storage. The depicted method 800 illustrates such a deduplication process implemented by the query controller 134 for the insertion of a data object into the single-instance store in the stacked memory 300.

The method 800 initiates at block 802 with receipt at the query controller 134 of an insert command (one example of the query command 310) from the external device 104. The insert command instructs the stacked-die memory device 102 to insert a data object into the single-instance store and return a handle or other pointer to the data object, which the external device 104 can later use to access the data object from the stacked-die memory device 102. In response to this insert command, the query controller 134 determines whether an instance of the data object is already present in the single-instance data store by searching the single-instance store in the stacked memory 300 for an instance of the data object. This search operation is conducted as described above with reference to FIGS. 5 and 6, with the data object serving as the search key and the data object fields being searched for a match.

In the event that an instance of the supplied data object is found at a location in the single-instance data store, at block 806 the query controller 134 returns the key stored in the key field of this location as the handle for the inserted data to the external device 104. Otherwise, in the event that no instance of the supplied data object is found in the single-instance store, at block 808 the query controller 134 generates a new key (using, for example, a value from the data object) and stores the key and the data object at a key field and data object field, respectively, of a location of the single-instance data store, and at block 810 the query controller 134 returns the new key as the handle for the inserted data to the external device 104. In either event, should the external device 104 need to access the data object from the single-instance store or delete the data object from the single instance store, the external device 104 can issue a search or read command referencing the key value to the stacked-die memory device 102, whereupon the query controller 134 can access the data object based on the search key. In this manner, multiple entities (e.g., processes, threads, applications, or devices) can share the same instance of a data object using the handle, or key, associated with the instance of the data object.

Further, to provide efficient use of the locations of the single-instance store, the query controller 134 can implement a reference count for the data object (stored in, for example, a reference count field of the location storing the data object), whereby the reference count specifies how many entities currently reference the instance of the data object. Whenever an entity issues an insert command for the data object, the reference count is incremented, and whenever an entity de-references the data object by issuing a free/clear/delete command to the stacked-die memory device 102 for the data object, the query controller 134 can decrement the reference count for the data object. When the reference count reaches zero, the data object is no longer referenced by an entity, and thus the query controller 134 can recoup the location by clearing the location storing the data object and making it available for storing a different data object. Moreover, this process can be extended to provide read-write functionality for the single-instance data store such that a write command issued by the external device 104 directs the query controller 134 to search for and delete the old data object, insert the new data object, and then return the key stored with the new data object as the new handle for the data object.

Figure 9:
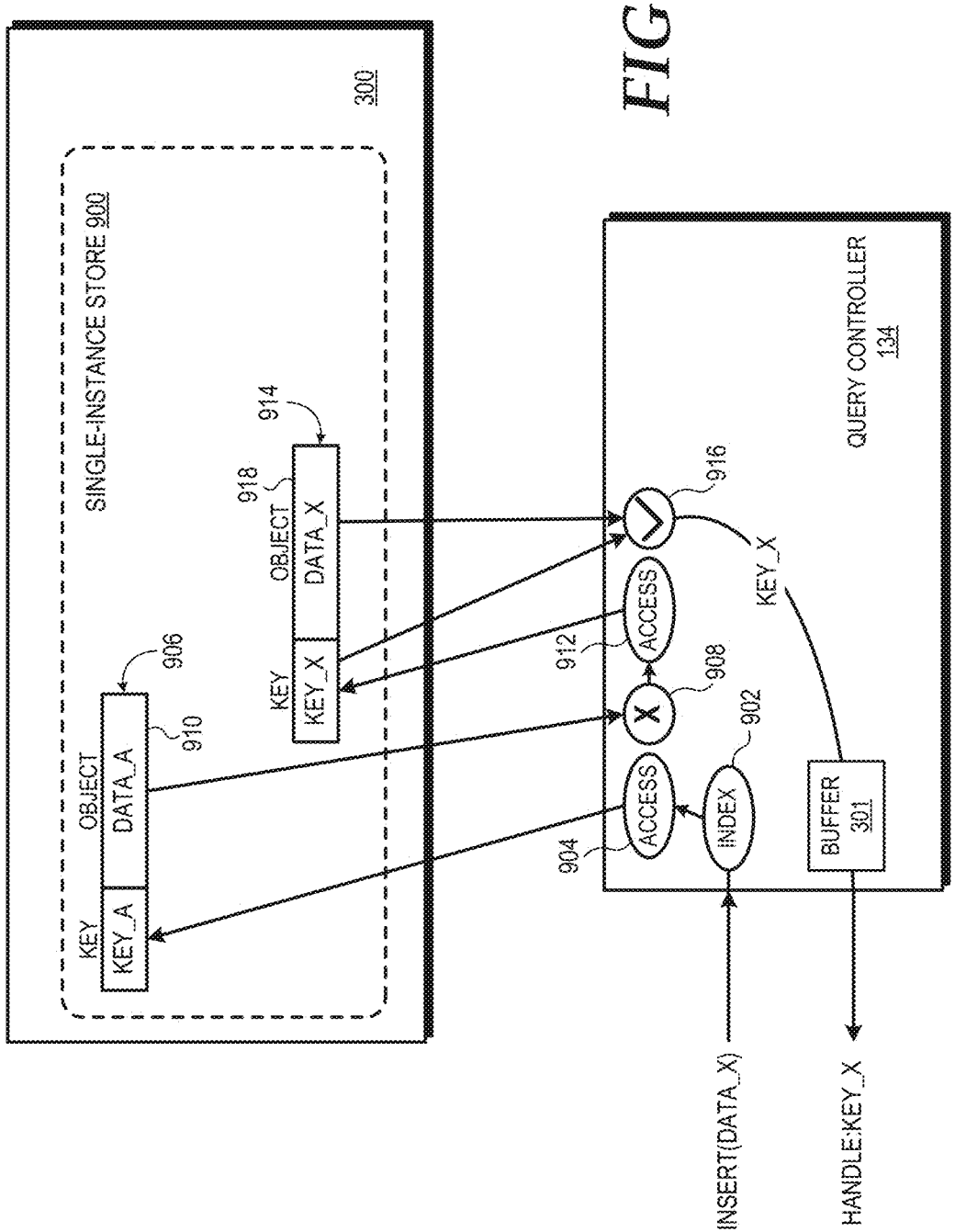
FIG. 9 is a block diagram illustrating an example of the method of FIG. 8 in accordance with some embodiments.
Figure 10:
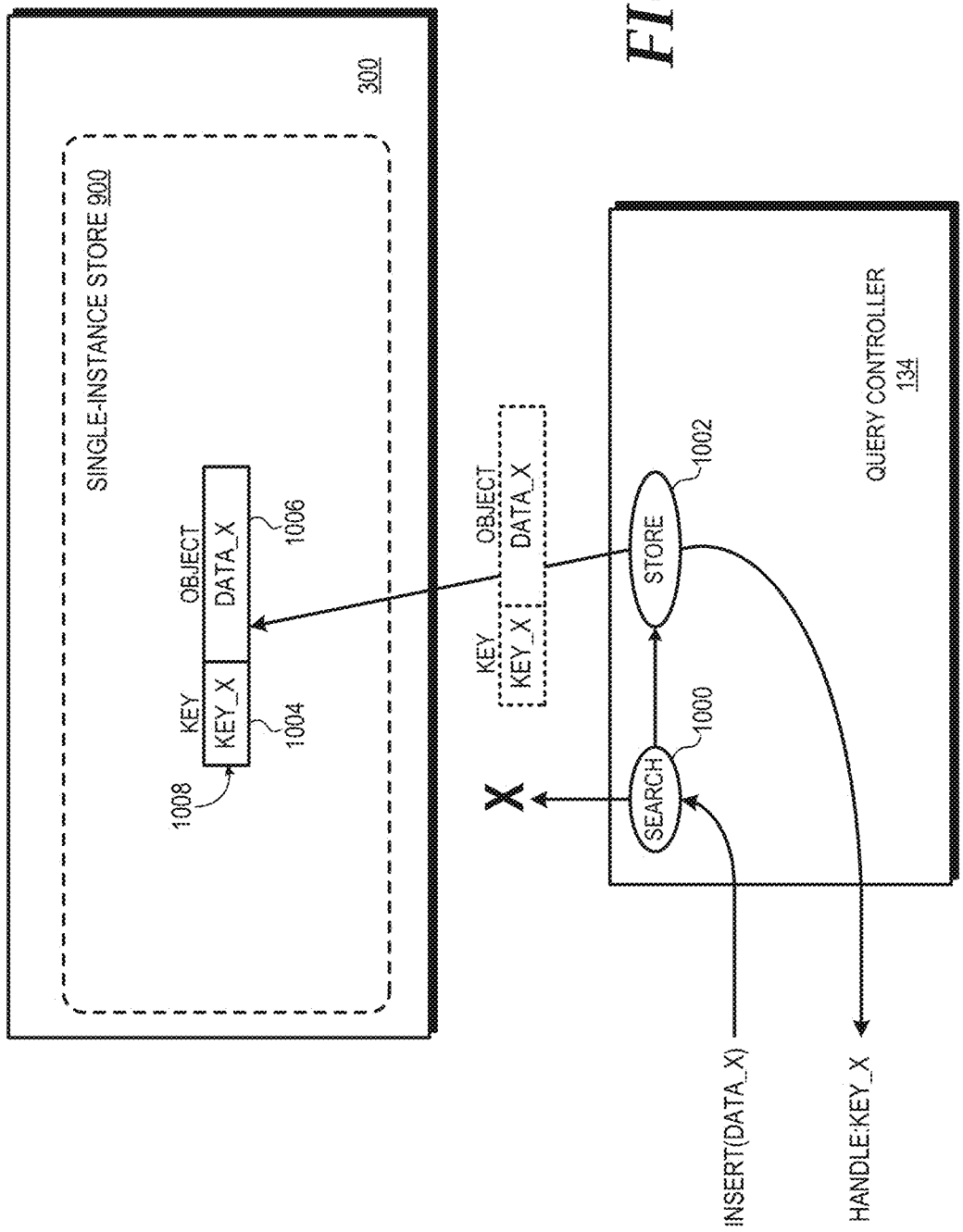
FIG. 10 is a block diagram illustrating another example of the method of FIG. 8 in accordance with some embodiments.

FIGS. 9 and 10 illustrate simplified example operations of the data object insertion method 800 of FIG. 8 in accordance with some embodiments. For FIG. 9, an instance of the data object is already present in the single-instance data store, whereas for FIG. 10, no such instance is present in the single-instance data store.

In the depicted example of FIG. 9, the external device 104 issues a query command 310 in the form of an insert command INSERT(DATA_X) that instructs the query controller 134 to insert the data object DATA_X in a single-instance store 900 implemented in the stacked memory 300. In response to this command, the hash logic 302 performs an indexing operation 902 by performing a hash operation on at least a portion of the data object DATA_X to generate an initial index value. The search access logic 303 then performs an access operation 904 to a location 906 in the single-instance store 900 having an address represented by the initial index value. The compare logic 304 performs a compare operation 908 to compare the data object DATA_A stored in the data object field 910 with the data object DATA_X. In this example, DATA_A is not a match to DATA_X, and thus the search access logic 303 increments the index value and performs another access operation 912 to a location 914 in the single-instance store 900 having an address represented by the incremented index value. The compare logic 304 performs a compare operation 916 to compare the data object stored in the data object field 918 with the data object DATA_X. In this instance, the comparison reveals a match (that is, the data object field 918 stores an instance of the data object DATA_X), and thus the query controller 134 accesses the key field 918 of the location 914 to obtain the key KEY_X stored therein, and outputs this key for forwarding to the external device 104 as the handle referencing the instance of the data object DATA_X stored in the single-instance store 900.

In the depicted example of FIG. 10, the external device 104 issues the same insert command INSERT(DATA_X) that instructs the query controller 134 to insert the data object DATA_X in a single-instance store 900 implemented in the stacked memory 300. However, in this example, the search operation 1000 performed by the query controller 134 in response reveals that the single-instance store 900 does not store an instance of the data object DATA_X. Accordingly, the query controller 134 performs a store operation 1002 to store an instance of the data object DATA_X in the single-instance store 900. To this end, the query controller 134 generates a key KEY_X from a portion of the data object DATA_X and stores the key KEY_X and the data object DATA_X at a key field 1004 and a data object field 1006, respectively, of a location 1008 in the single-instance store 900, and then outputs this key for forwarding to the external device 104 as the handle referencing the instance of the data object DATA_X stored in the single-instance store 900.

In some embodiments, the apparatus and techniques described above are implemented in a system comprising one or more integrated circuit (IC) devices (also referred to as integrated circuit packages or microchips), such as the logic dies, memory dies, and stacked-die memory devices described above with reference to FIGS. 1-11. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 11:
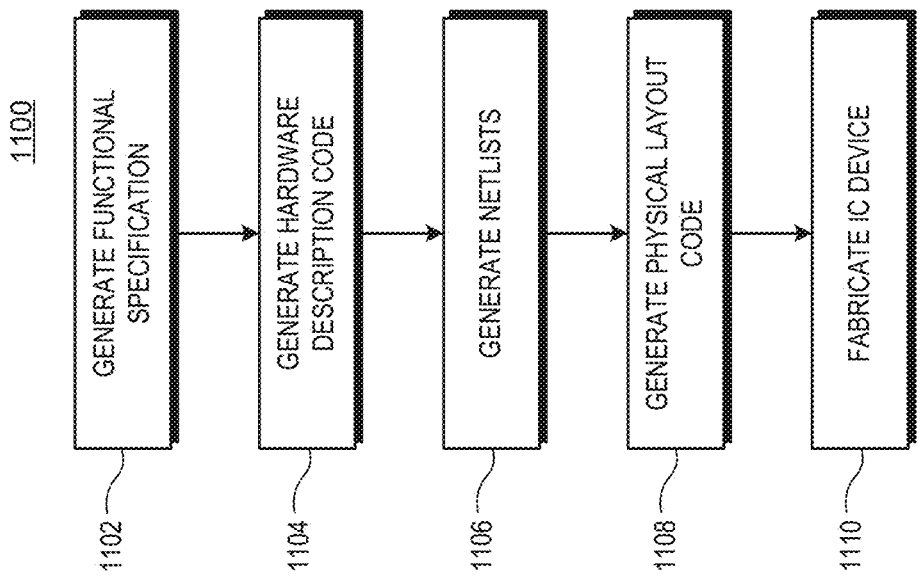
FIG. 11 is a flow diagram illustrating a method for designing and fabricating at least one die of an integrated circuit (IC) device implementing a stacked-die memory device in accordance with some embodiments.

FIG. 11 is a flow diagram illustrating an example method 1100 for the design and fabrication of an IC device implementing one or more aspects in accordance with some embodiments. As noted above, the code generated for each of the following processes is stored or otherwise embodied in non-transitory computer readable storage media for access and use by the corresponding design tool or fabrication tool.

At block 1102 a functional specification for the IC device is generated. The functional specification (often referred to as a micro architecture specification (MAS)) may be represented by any of a variety of programming languages or modeling languages, including C, C++, SystemC, Simulink, or MATLAB.

At block 1104, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 1106 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 1108, one or more EDA tools use the netlists produced at block 1106 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 1010, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A system, comprising:
an inter-device interconnect;
a processing device including a memory controller coupled to the inter-device interconnect and configured to issue a query command; and
an integrated circuit (IC) package coupled to the processing device via the inter-device interconnect, the IC package comprising:
a set of one or more stacked memory dies implementing memory cell circuitry; and
a set of one or more logic dies electrically coupled to the memory cell circuitry, the set of one or more logic dies comprising a query controller and a memory interface, wherein the memory interface is coupleable to the processing device, and wherein the query controller is to perform a query operation including a search of data stored in the memory cell circuitry responsive to receiving the query command from the memory controller of the processing device.

2. The system of claim 1, wherein:
the processing device is to execute software instructing the memory controller to issue the query command to the IC package.

3. The system of claim 1, wherein:
the memory cell circuitry implements a key-value store;
the query command comprises a key search command; and
the query operation comprises searching the key-value store for a key specified by the key search command and outputting a data object stored in the key-value store in association with the key.

4. The system of claim 3, wherein:
the key-value store implements a cache;
the key search command comprises a cache access command;
the key comprises a tag value associated with the cache access command; and
the data object comprises a cache line of the cache.

5. The system of claim 1, wherein:
the memory cell circuitry implements a key-value store;
the query command comprises a data search command; and
the query operation comprises searching the key-value store for a data object specified by the data search command and outputting a key stored in the key-value store in association with the data object.

6. The system of claim 1, wherein:
the memory cell circuitry implements a single-instance store;
the query command comprises an insert command to insert a data object into the single-instance store; and
the query operation comprises searching the single-instance store and, in response to identifying an instance of the data object already stored in the single-instance store, outputting to the processing device a key stored in the single-instance store in association with the instance of the data object.

7. The system of claim 6, wherein the query operation further comprises inserting the data object into the single-instance store, storing a new key in the single-instance store in association with the data object, and outputting to the processing device the new key in response to identifying that the single-instance store does not already store an instance of the data object.

8. The system of claim 1, wherein the query controller comprises:
hash logic to generate an index value based on a search value associated with the query command;
search access logic to access a data object stored at a location in the memory cell circuitry based on the index value; and
compare logic to identify a match between the accessed data object and the search value based on a search criterion associated with the query command.

9. The system of claim 1, wherein the memory interface is configured to perform memory accesses in response to memory access requests from both the query controller and the processing device.

10. The system of claim 1, wherein the processing device offloads a task of managing query operations from the processing device to the IC package.

11. A method comprising:
providing an integrated circuit (IC) package including a set of one or more stacked memory dies implementing memory cell circuitry, and a set of one or more logic dies electrically coupled to the memory cell circuitry, the set of one or more logic dies having a memory interface and a query controller; and
performing, via the query controller, a query operation on data stored in the memory cell circuitry in response to a query command received from a memory controller of a processing device external to the IC package.

12. The method of claim 11, wherein:
the memory cell circuitry implements a key-value store;
the query command comprises a key search command; and
performing the query operation comprises:
searching the key-value store for a key specified by the key search command; and
in response to locating the key in the key-value store, outputting a data object stored in the key-value store in association with the key.

13. The method of claim 11, wherein:
the memory cell circuitry implements a key-value store;
the query command comprises a data search command; and
performing the query operation comprises:
searching, via the query controller, the key-value store for a data object specified by the data search command; and
in response to locating the data object in the key-value store, outputting to the processing device a key stored in the key-value store in association with the data object.

14. The method of claim 11, wherein:
the memory cell circuitry implements a single-instance store;
the query command comprises an insert command to insert a data object into the single-instance store; and
performing the query operation comprises:
searching, via the query controller, the single-instance store for the data object; and
in response to identifying an instance of the data object already stored in the single-instance store, outputting to the processing device a key stored in the single-instance store in association with the instance of the data object.

15. The method of claim 11, further comprising:
transmitting, from the memory controller, the query command to the IC package to offload processing efforts of conducting query operations from the processing device to the query controller.

16. A system, comprising:

an inter-device interconnect;

an integrated circuit (IC) package including a query controller and a set of one or more stacked memory dies implementing memory cell circuitry; and a processing device including a memory controller coupled to the IC package via the inter-device interconnect, the processing device comprising:

a set of one or more processor cores; and a memory controller configured to issue a query command to request a search of data stored in the memory cell circuitry of the IC package.

17. The system of claim 16, wherein:

the query command comprises a specified memory address; and the query controller of the IC package initiates a performance of a query operation specified by the query command to access a location in the memory cell circuitry corresponding to the specified memory address.

18. The system of claim 16, wherein:

the query command comprises a key search command; and the query controller searches, based on the key search command, for a key-value store implemented in the memory cell circuitry of the IC package for a key specified by the key search command and outputs a data object stored in the key-value store in association with the key to the processing device.

19. The system of claim 16, wherein:

the query command comprises a data search command; and the query controller searches, based on the data search command, for a key-value store implemented in the memory cell circuitry of the IC package for a data object specified by the data search command and outputs a key stored in the key-value store in association with the data object to the processing device.

20. The system of claim 16, wherein:

the memory cell circuitry implements a single-instance store;

the query command comprises an insert command to insert a data object into the single-instance store; and the query controller searches, based on the insert command, for an instance of the data object already stored in a single-instance store implemented in the memory cell circuitry of the IC package and outputs to the processing device a key stored in the single-instance store in association with the instance of the data object.

* * * * *